(12) United States Patent
Greene et al.

(10) Patent No.: US 10,797,154 B2
(45) Date of Patent: Oct. 6, 2020

(54) TRENCH SILICIDE CONTACTS WITH HIGH SELECTIVITY PROCESS

(71) Applicants:INTERNATIONAL BUSINESS MACHINES CORPORATION, Armonk, NY (US); GLOBALFOUNDRIES Inc., Grand Cayman (KY)

(72) Inventors: Andrew M. Greene, Albany, NY (US); Balasubramanian Pranatharthiharan, Watervliet, NY (US); Ruilong Xie, Niskayuna, NY (US)

(73) Assignees: INTERNATIONAL BUSINESS MACHINES CORPORATION, Armonk, NY (US); GLOBALFOUNDRIES INC., Grand Cayman (KY)

(*) Notice: Subject to any disclaimer, the term of this patent is extended or adjusted under 35 U.S.C. 154(b) by 17 days.

(21) Appl. No.: 15/190,778

(22) Filed: Jun. 23, 2016

(65) Prior Publication Data

US 2017/0125292 A1    May 4, 2017

Related U.S. Application Data

(62) Division of application No. 14/928,719, filed on Oct. 30, 2015, now Pat. No. 9,923,078.

(51) Int. Cl.
*H01L 21/768* (2006.01)
*H01L 29/66* (2006.01)
(Continued)

(52) U.S. Cl.
CPC .......... *H01L 29/665* (2013.01); *H01L 21/283* (2013.01); *H01L 21/30604* (2013.01);
(Continued)

(58) Field of Classification Search
CPC ................................................. H01L 21/76897
(Continued)

(56) References Cited

U.S. PATENT DOCUMENTS 6,465,310 B2   10/2002   Lee et al.
8,377,795 B2   2/2013    Kanakasabapathy et al.
(Continued)

OTHER PUBLICATIONS

IBM, "Trench Silicide contacts," IP.com, Jul. 2009. (pp. 1-2).
(Continued)

*Primary Examiner* — Hsin Yi Hsieh
(74) *Attorney, Agent, or Firm* — Tutunjian & Bitetto, P.C.; Vazken Alexanian

(57) ABSTRACT

A method for forming self-aligned contacts includes patterning a mask between fin regions of a semiconductor device, etching a cut region through a first dielectric layer between the fin regions down to a substrate and filling the cut region with a first material, which is selectively etchable relative to the first dielectric layer. The first dielectric layer is isotropically etched to reveal source and drain regions in the fin regions to form trenches in the first material where the source and drain regions are accessible. The isotropic etching is super selective to remove the first dielectric layer relative to the first material and relative to gate structures disposed between the source and drain regions. Metal is deposited in the trenches to form silicide contacts to the source and drain regions.

18 Claims, 14 Drawing Sheets

(51) Int. Cl.
*H01L 21/283* (2006.01)
*H01L 27/088* (2006.01)
*H01L 29/417* (2006.01)
*H01L 23/485* (2006.01)
*H01L 29/78* (2006.01)
*H01L 23/532* (2006.01)
*H01L 23/535* (2006.01)
*H01L 21/306* (2006.01)
*H01L 21/8234* (2006.01)
*H01L 29/08* (2006.01)

(52) U.S. Cl.
CPC .. *H01L 21/76805* (2013.01); *H01L 21/76843* (2013.01); *H01L 21/76889* (2013.01); *H01L 21/76895* (2013.01); *H01L 21/76897* (2013.01); *H01L 21/823418* (2013.01); *H01L 21/823431* (2013.01); *H01L 21/823475* (2013.01); *H01L 23/485* (2013.01); *H01L 23/535* (2013.01); *H01L 23/53223* (2013.01); *H01L 23/53266* (2013.01); *H01L 27/0886* (2013.01); *H01L 29/0847* (2013.01); *H01L 29/41791* (2013.01); *H01L 29/66795* (2013.01); *H01L 29/785* (2013.01); *H01L 29/7851* (2013.01); *H01L 21/76885* (2013.01)

(58) Field of Classification Search
USPC ........................................................ 257/384
See application file for complete search history.

(56) References Cited

U.S. PATENT DOCUMENTS

| | | | |
|---|---|---|---|
| 8,415,250 B2 | 4/2013 | Alptekin et al. | |
| 8,440,533 B2 | 5/2013 | Toh et al. | |
| 8,617,996 B1 | 12/2013 | Chi et al. | |
| 8,878,311 B2 | 11/2014 | Cheng et al. | |
| 8,927,378 B2 | 1/2015 | Pei et al. | |
| 2010/0197141 A1 | 8/2010 | Tu et al. | |
| 2012/0021204 A1 | 1/2012 | Pei et al. | |
| 2012/0139062 A1 | 6/2012 | Yuan et al. | |
| 2013/0187171 A1 | 7/2013 | Guillorn et al. | |
| 2015/0145065 A1 | 5/2015 | Kanakasabapathy et al. | |
| 2015/0243663 A1 | 8/2015 | Hung et al. | |
| 2015/0270179 A1* | 9/2015 | Alptekin | H01L 21/28512 257/757 |
| 2015/0372144 A1 | 12/2015 | Fang et al. | |
| 2016/0049394 A1* | 2/2016 | Shin | H01L 27/0886 257/401 |
| 2016/0163585 A1* | 6/2016 | Xie | H01L 21/76843 257/368 |

OTHER PUBLICATIONS

List of IBM Patents or Patent Applications Treated as Related dated Jun. 23, 2016, 2 pages.
U.S. Office Action issued in U.S. Appl. No. 15/276,060 dated Jan. 22, 2019, 11 pages.
U.S. Office Action issued in U.S. Appl. No. 15/847,186, dated Feb. 14, 2019, 12 pages.
U.S. Office action issued in U.S. Appl. No. 15/847,186 dated Jun. 13, 2019, 10 pages.
U.S. Office Action issued in U.S. Appl. No. 15/276,060, dated Mar. 28, 2019, 10 pages.

* cited by examiner

TRENCH SILICIDE CONTACTS WITH HIGH SELECTIVITY PROCESS

BACKGROUND

Technical Field

The present invention relates to semiconductor processing, and more particularly to methods and devices having a selective self-aligned contact etching process to minimize spacer erosion when forming source and drain contacts in devices with highly scaled gate pitches.

Description of the Related Art

One commonly employed technique for forming gate structures involves forming a line-type gate electrode structure above a layer of insulating material that is formed above an active region defined in a semiconductor substrate. Typically, the line-type gate electrode structures are formed by defining long parallel line-type structures, i.e., gate electrode structures that extend across multiple spaced-apart active regions and the isolation regions formed in the substrate between such spaced-apart active regions. At some point later in the process flow, these long, line-type gate electrode structures are subsequently "cut" by performing an etching process to define the gate electrodes having the desired length in the "gate-width" direction of the transistor device. This results in substantially rectangular shaped gate structures (when viewed from above) having the desired dimensions in the gate-length and gate width directions.

After the gate electrodes are patterned, a sidewall spacer is typically formed around the perimeter of the substantially rectangular shaped gate structure, i.e., the spacer is formed adjacent on all four side sidewalls (two sidewalls and two end surfaces) of each of the patterned gate electrodes. In some cases, a thin liner layer may be formed on the gate structure prior to forming the sidewall spacer. The sidewall spacer, in combination with the gate cap layer, function to protect the gate electrode structure in subsequent processing operations.

Unfortunately, as device dimensions have decreased and packing densities have increased, it is more likely that, when epi semiconductor material is formed in the source/drain regions, some of the epi material may undesirably form on the end surfaces of the polysilicon/amorphous silicon gate electrode. This may occur for several reasons. As noted above, after the gate structures are patterned, a sidewall spacer is formed around all four sides of the gate structure so as to, along with the gate cap layer, encapsulate and protect the gate electrode during subsequent processing operations. As packing densities have increased, the end-to-end spacing between two different gate electrode structures formed above two different active regions has decreased, thereby limiting the physical size, i.e., the width, of the protective sidewall spacers. Additionally, as the pitch between adjacent gate structures has decreased, the width of the protective sidewall spacers must also be decreased.

With respect to forming a sidewall spacer on a device, the duration of the etching process performed to form the spacer is typically increased to ensure that the layer of spacer material is completely cleared from the surfaces of the source/drain regions of the device. This over-etching also tends to reduce the width of the protective spacer. All of these factors and others tend to result in an undesirable thinning of the spacer, particularly at the corner of the gate electrode (the intersection between the side surfaces and the end surfaces of the gate electrode). It is not uncommon that, due to these factors and others, some portion of the polysilicon or amorphous silicon gate electrode material will be exposed at the time epi semiconductor material is formed in the source/drain regions of a planar or FinFET device. As a result, epi semiconductor material will undesirably form on the exposed portions of the gate electrode layer.

The extent and amount of undesirable epi semiconductor material formation will vary depending upon the particular application and the quality of the manufacturing processes used to manufacture the device. As a result of such undesirable and unpredictable epi formation, the resulting semiconductor devices and the integrated circuits including such devices may completely fail or operate at less than acceptable performance levels. Even after gate formation additional processing can still expose sidewall spacers to damage.

For example, current self-aligned contact (SAC) etches employ an oxide plasma dry etch which is selective to SiN to open source/drain (S/D) contact regions. Process margin for this type of process becomes smaller for small nodes (e.g., 7 nm), given the fact that SAC cap thickness may be reduced to only 25 nm, and spacer thickness may be only about 6 nm. This means even a 2 nm spacer thin down during the SAC etch will fail the minimum insulator rule of greater than >5 nm. Scaling of spacers and thinning due to scaling and erosion may result in increased risk of shorts between S/D regions and gate contacts.

SUMMARY

A method for forming self-aligned contacts includes patterning a mask between fin regions of a semiconductor device; etching a cut region through a first dielectric layer between the fin regions down to a substrate; filling the cut region with a first material, which is selectively etchable relative to the first dielectric layer; isotropic etching the first dielectric layer to reveal source and drain regions in the fin regions to form trenches in the first material where the source and drain regions are accessible, the isotropic etching being super selective to remove the first dielectric layer relative to the first material and relative to gate structures disposed between the source and drain regions; and depositing metal in the trenches to form silicide contacts to the source and drain regions.

Another method for forming self-aligned contacts include etching a cut region through a first dielectric layer between fin regions of a semiconductor device down to a substrate; filling the cut region with a first material, which is selectively etchable relative to the first dielectric layer; planarizing the first material and stopping on the first dielectric layer to form a planar surface; forming and patterning a second dielectric layer on the planar surface to expose portions of the first dielectric layer; isotropic etching the first dielectric layer to expose source and drain regions in the fin regions to form trenches in the first material where the source and drain regions are accessible, the isotropic etching being super selective to remove the first dielectric layer relative to the first material, the second dielectric layer and gate structures, the gate structures being disposed between the source and drain regions; depositing metal in the trenches to form contacts to the source and drain regions; and replacing the second dielectric layer with a second dielectric material.

A device having self-aligned contacts includes a cut region formed between fin regions down to a substrate of a semiconductor device, the cut region including a nitride material. Source and drain regions are disposed in the fin regions, and gate structures are disposed between the source and drain regions. Silicide contacts are connected to the source and drain regions, wherein the silicide contacts have a width that is larger in contact with the source and drain regions and reduced with height to a level of the gate structures.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
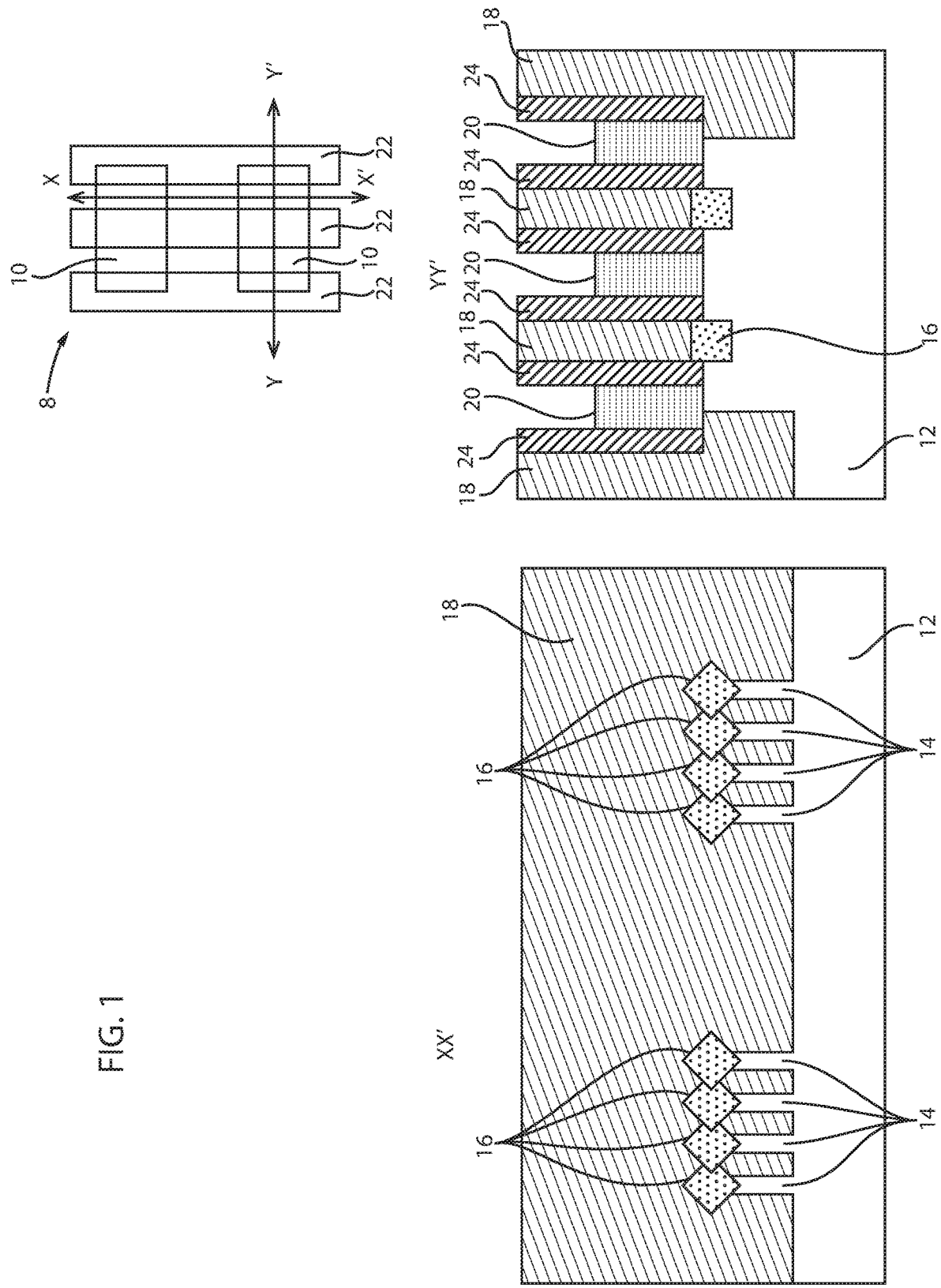
FIG. 1 is a cross-sectional view of a semiconductor device showing a schematic top view and two cross-sectional views depicting a post recess of a gate conductor in accordance with the present principles.

In accordance with the present principles, devices and methods are provided for improvements in is self-aligned contact (SAC) etchings and processing. SACs or CA contacts are formed through at least one dielectric layer to land, self-aligned, on trench silicide (TS) contacts. The silicide contacts may an electrical connection with source/drain regions of field effect transistors (FETs). In the present example, the FETs will include finFETs although the present principles are applicable to other forms of devices (e.g., planar, etc.). In useful embodiments, structures are provided to assist in improving selectivity to preserve dielectric material during contact formation. In one example, SACs are formed through a dielectric material that is highly selectively etchable relative to other materials present which may otherwise experience losses due to inadequate etch selectivity.

Instead of a directional dry etch (e.g., with oxygen plasma to etch carbon based layers (e.g., OPL, resist), or F-based plasma to etch $SiO_2$), an isotropic etch is employed to form SAC openings in the materials present. In one embodiment, the isotropic etch includes a buffered hydrofluoric (BHF) etch or a chemical oxide removal (COR) isotropic oxide removal etch, which gives a much better oxide etch selectivity than a dry etch. Isotropic oxide etches, while useful, have the potential to blow-up the contact critical dimensions (CD), and cause shorts, such as, silicided contact/region tip-to-tip shorts or CA/TS shorts to the gate electrode due to spacer thinning, since isotropic etching does not etch in a single direction, but rather etches in all directions (e.g., horizontally as well as vertically) in the material.

The present principles utilize a selective, isotropic etch of a dielectric layer, e.g., oxide, during a SAC etch (e.g., BHF or COR) to minimize damage to spacers and provide CD control to achieve target design rule (DR) specifications using special structures to achieve these goals in a controlled manner. In one embodiment, a nitride material, e.g., SiN, is employed between contacts as a bottom dielectric layer instead of a conventional $SiO_2$ material. Spacer thickness is maintained at substantially its original dimensions before the SAC etch. Spacer profiles versus unetched inactive regions over shallow trench isolation regions showed the same spacer thickness (within tolerance). A contact open angle is less than 90° for silicide contacts. This is in comparison to a greater than 90° open angle for conventional directional dry etching.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of" for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements, FIGS. 1-8, 10-12 each includes an illustrative top view 8 which includes a section line XX' transversely through fins and a section line YY' transversely through gate structures. Cross-sectional views at each of XX' and YY' are shown in each of FIGS. 1-8, 10-12. It should be understood that fin regions 10 include S/D regions. Regions 22 include gate structures 20, which may be active or dummy gate structures. The present principles are applicable to gate first and gate last processes.

Referring to FIG. 1, the cross-sections taken at section lines XX' and YY' are depicted after a gate conductor 20 (as well as a work function metal and high-k gate dielectric (not shown)) is deposited, planarized and recessed in gate structures 22. The gate conductor 20 may include a metal, e.g., W or other suitable material. Fins 14 have been etched into a substrate 12. The fins 14 and the substrate 12 may include a monocrystalline silicon, although other suitable substrate materials may be employed. In one embodiment, the fins 14 are buried in a dielectric material, which is recessed to expose a portion of the fins 14. The portion of the fins 14 is subjected to an epitaxial growth process to form S/D regions 16 on the fins 14. The S/D regions 16 and the fins 14 are buried in a dielectric layer 18. The dielectric layer 18 may include a flowable oxide or other suitable dielectric material.

Gate structures 22 include completed gate structures (for gate-first or gate-last designs). For gate structures, the gate material includes a gate dielectric (e.g., high-k material (not shown)) and the gate conductor 20 (e.g., metal, such as W). The gate conductor 20 may also include a work function metal. The gate structures 22 have S/D regions 16 formed on opposite sides of the gate structure 22, e.g., by epitaxial growth processing. The gate structures 22 include sidewall spacers 24, which may include a nitride material. S/D regions 16 may be grown on the fins 14 between gates structures 22 by an epitaxial growth process.

Figure 2:
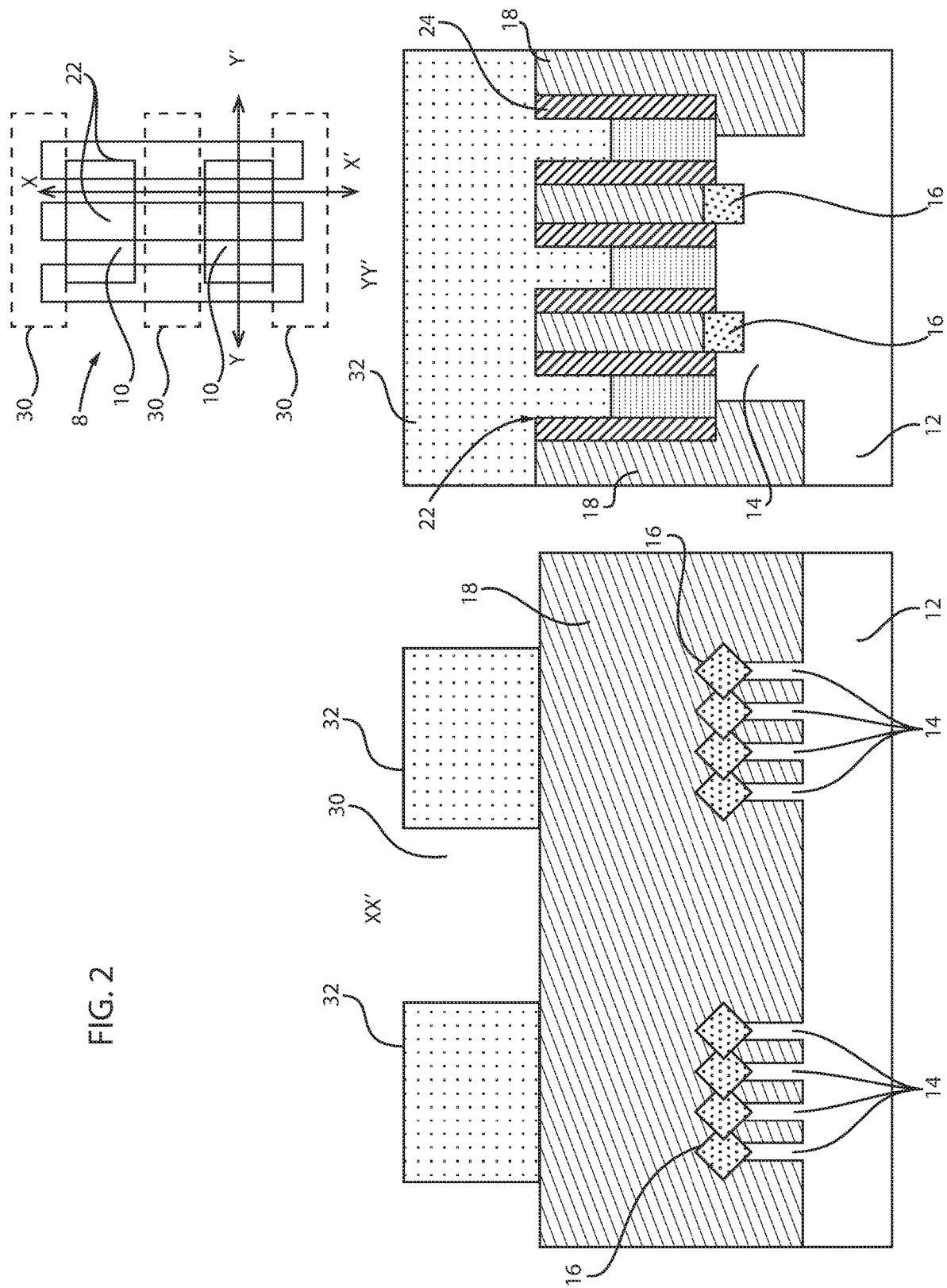
FIG. 2 is a cross-sectional view of the semiconductor device of FIG. 1 showing a schematic top view and two cross-sectional views depicting a patterning of an organic planarizing layer in accordance with the present principles.

Referring to FIG. 2, an organic planarizing (or patterning) layer (OPL) 32 (or organic dielectric layer (ODL)) is deposited over a top surface of the device on the layer 18 and over the gate structures 22. The OPL 32 is patterned using a mask (silicide contact mask or TS mask) to form openings 30 in the OPL 32. The OPL 32 may include a photo-sensitive organic polymer comprising a light-sensitive material that, when exposed to electromagnetic (EM) radiation, is chemically altered and thus configured by the mask (not shown) to be removed using a developing solvent. For example, the photo-sensitive organic polymer may be polyacrylate resin, epoxy resin, phenol resin, polyamide resin, polyimide resin, unsaturated polyester resin, polyphenylenether resin, polyphenylenesulfide resin, poly(methyl methacrylate) or benzocyclobutene (BCB).

The patterning of regions 32 and 30 corresponds with the fin region 10 wherein S/D regions 16 are formed on the fins 14. The OPL 32 fills the recessed regions on top of gate conductor 20 in the gate structures 22.

Figure 3:
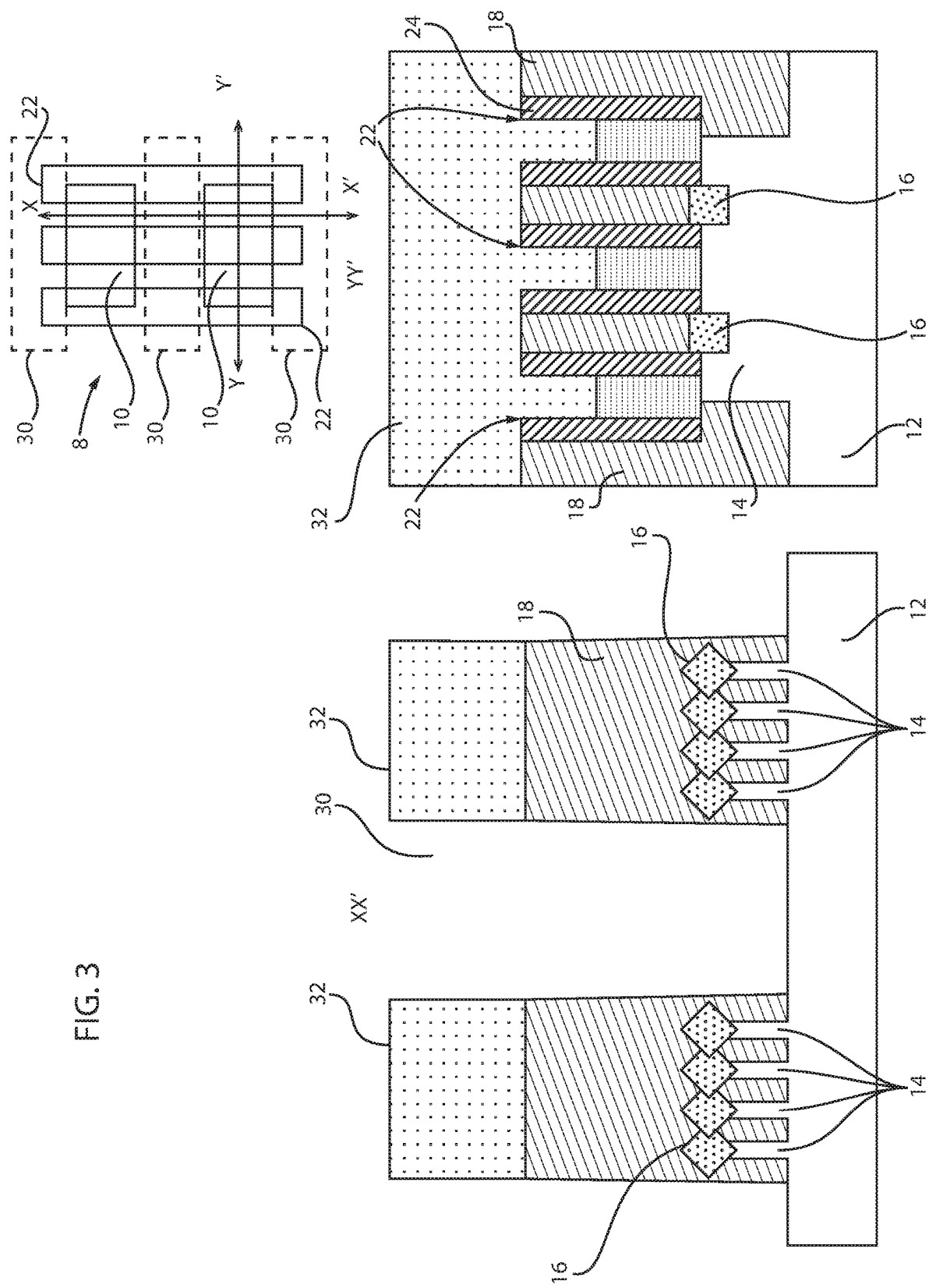
FIG. 3 is a cross-sectional view of the semiconductor device of FIG. 2 showing a schematic top view and two cross-sectional views depicting formation of a contact trench in dielectric down to a substrate in accordance with the present principles.

Referring to FIG. 3, the OPL 32 is employed as an etch mask to extend recesses 30 in the dielectric layer 18. The OPL 32 may be etched using a reactive ion etch (RIE) process.

Figure 4:
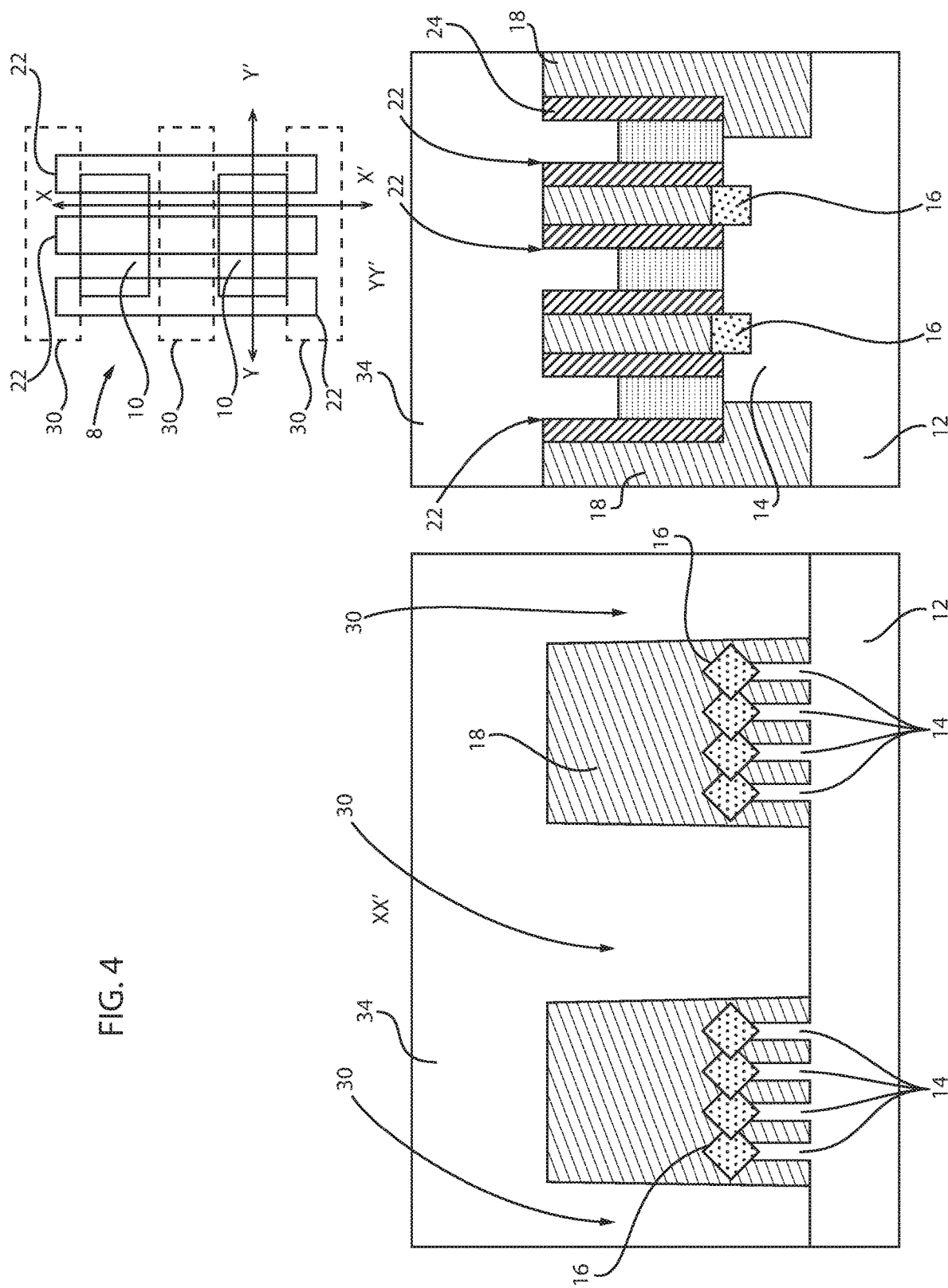
FIG. 4 is a cross-sectional view of the semiconductor device of FIG. 3 showing a schematic top view and two cross-sectional views depicting formation of a dielectric material in a contact trench opening in accordance with the present principles.

Referring to FIG. 4, the OPL 32 is stripped off using, e.g., an ash process or wets removal. This exposes the gate conductors 20, spacers 24 and the dielectric layer 18. Within dielectric layer 18, the S/D regions 16 and fins 14 remain protected. A dielectric layer 34 is deposited to fill in regions 30, over the dielectric layer 18 and fill the gate structures 22 on the gate conductor 20. The dielectric layer 34 overfills the regions 30. The dielectric layer 34 is formed from a material that can be selectively etched relative to the dielectric layer 18. In one embodiment, dielectric layer 18 may include an oxide, and dielectric layer 34 may include a nitride (e.g., SiN).

Figure 5:
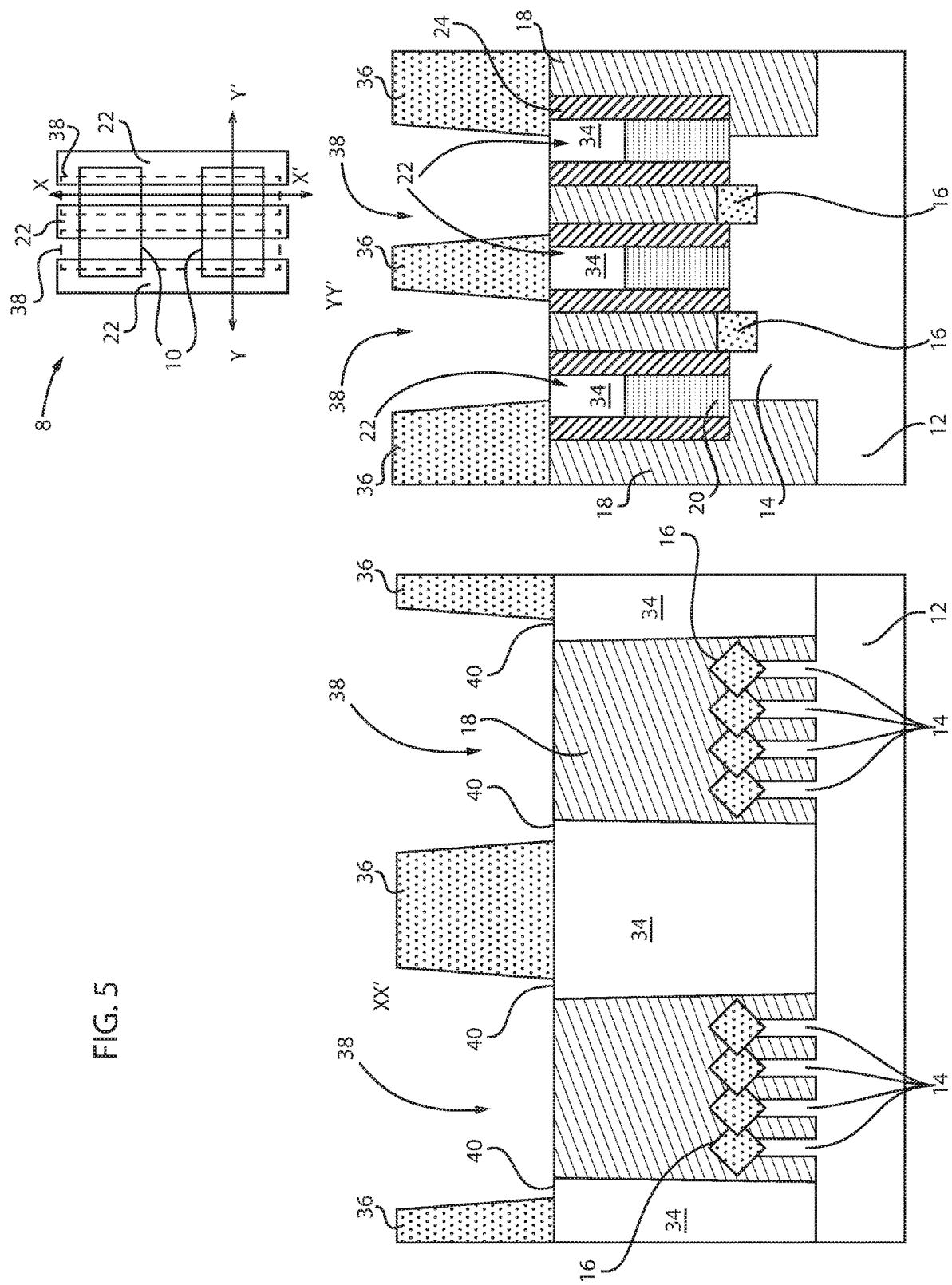
FIG. 5 is a cross-sectional view of the semiconductor device of FIG. 4 showing a schematic top view and two cross-sectional views depicting a pattern formed for etching material in source/drain contact trenches in accordance with the present principles.

Referring to FIG. 5, the dielectric layer 34 is planarized down to the dielectric layer 18 by a planarization process, such as, e.g., a chemical mechanical polish (CMP). Then, a dielectric or amorphous carbon material 36 is deposited over the dielectric layer 34 (e.g., SiN) and dielectric layer 18 for forming local interconnects. The material 36 is patterned using lithographic processes to open up regions 38 to expose spacers 24 and dielectric layer 18 over the S/D regions 16. The patterning of the material 36 exposes edges 40 of the dielectric layer 34. The material 36 may include amorphous carbon or other material that withstands etching of the dielectric layer 18 as will be described. The dielectric layer 34 forms caps on the gate conductor 20 in the gate structures 22.

Figure 6:
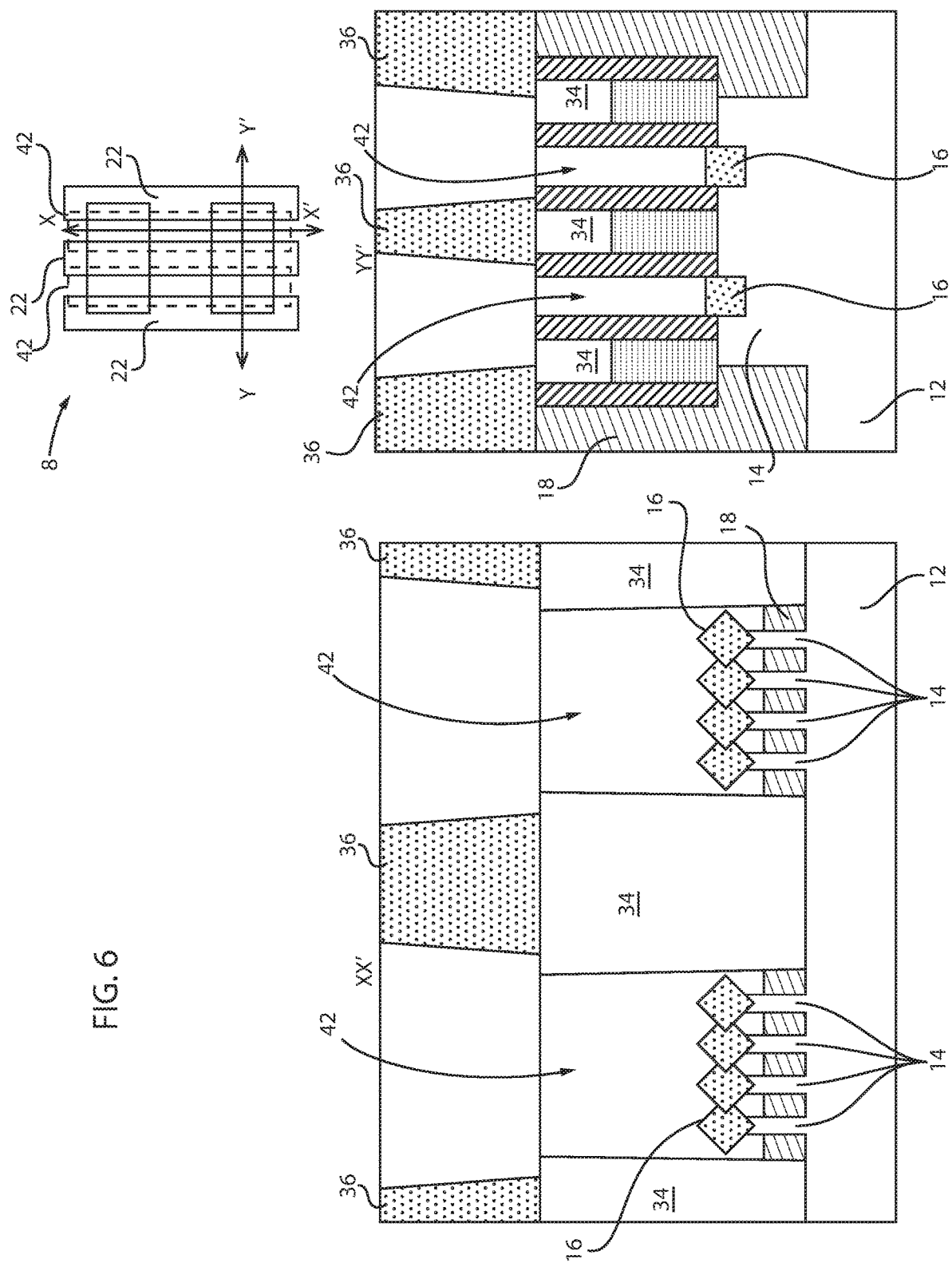
FIG. 6 is a cross-sectional view of the semiconductor device of FIG. 5 showing a schematic top view and two cross-sectional views depicting the material in the source/drain contact trenches removed in accordance with the present principles.

Referring to FIG. 6, an isotropic etch is performed to remove the dielectric layer 18 and recess the dielectric layer 18 to expose the S/D regions 16. The dielectric layer 18 may be overetched to reveal a portion of the fins 14. A thin liner, e.g., SiN, (not shown) may be formed on the region 16 and fins 14 to provide an etch stop and protect the epi (16) and fin materials (14). The thin liner is removed prior to silicide formation. The etch process removes the dielectric layer 18 selectively to the dielectric layer 34 and to the dielectric material 36 to form trenches 42. The S/D regions 16 are now accessible to form a silicide contact down to the S/D regions 16 and the etch stop/SiN liner is removed before silicide formation.

The isotropic etch may include a BHF wet or dry etch, or a chemical oxide removal (COR) process etch. The isotropic etch is preferably a dry selective etch. The isotropic etch is highly selective and removes/recesses dielectric layer 18, e.g., an oxide, with respect to the dielectric layer 34 (e.g., SiN), and dielectric material 36 (e.g., amorphous C). The dielectric layer 34 and dielectric material 36 remain virtually intact. In one embodiment, the selectivity for removing SiO$_2$ to SiN for BHF>200:1, for COR~100:1. The highly selective process protects gate structures and in particular spacers 24, which prevents S/D region to gate shorting.

Figure 7:
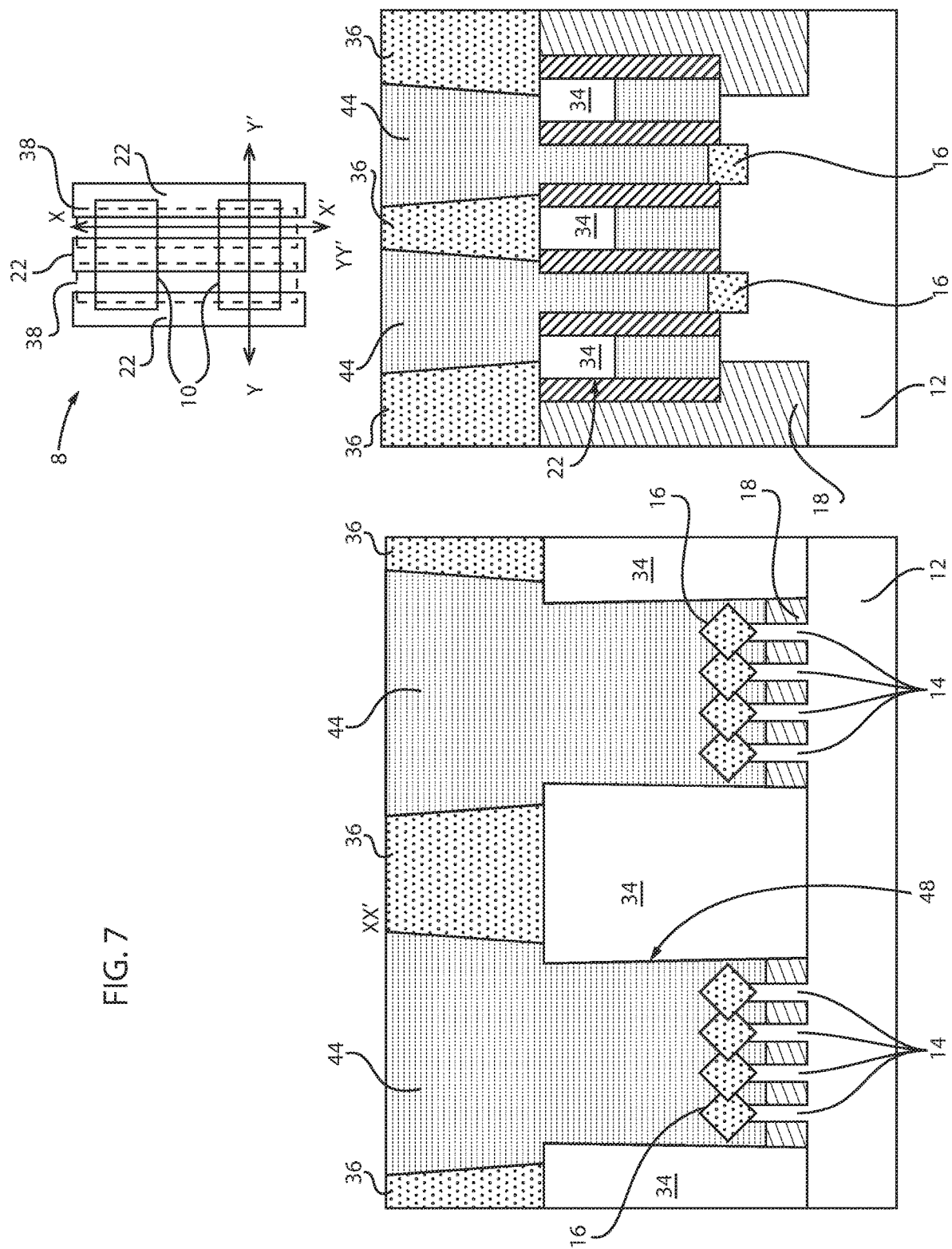
FIG. 7 is a cross-sectional view of the semiconductor device of FIG. 6 showing a schematic top view and two cross-sectional views depicting formation of trench silicide contacts (TS) and self-aligned contacts (CA) in a single metallization process in accordance with the present principles.

Referring to FIG. 7, the protective SiN liner is selectivity removed before silicide formation and contact formation. A metal silicide is formed on the regions 16 by depositing a metal and annealing. Then, self-aligned contacts 44 are formed in the trenches 42 (FIG. 6). The contacts 44 may include a liner (not shown). The liner may include, e.g., TiN, although other materials may be employed. Examples of other liner materials include, e.g., TaN, Al$_2$O$_3$, etc. The liner thickness need only be a few nanometers in thickness. The contacts 44 are formed from a metal, such as W, Al, Ti, etc. After formation of the contact material (metal and liner), a CMP process is performed to planarize a top surface. The contacts 44 land on and connect to the S/D regions 16.

Figure 8:
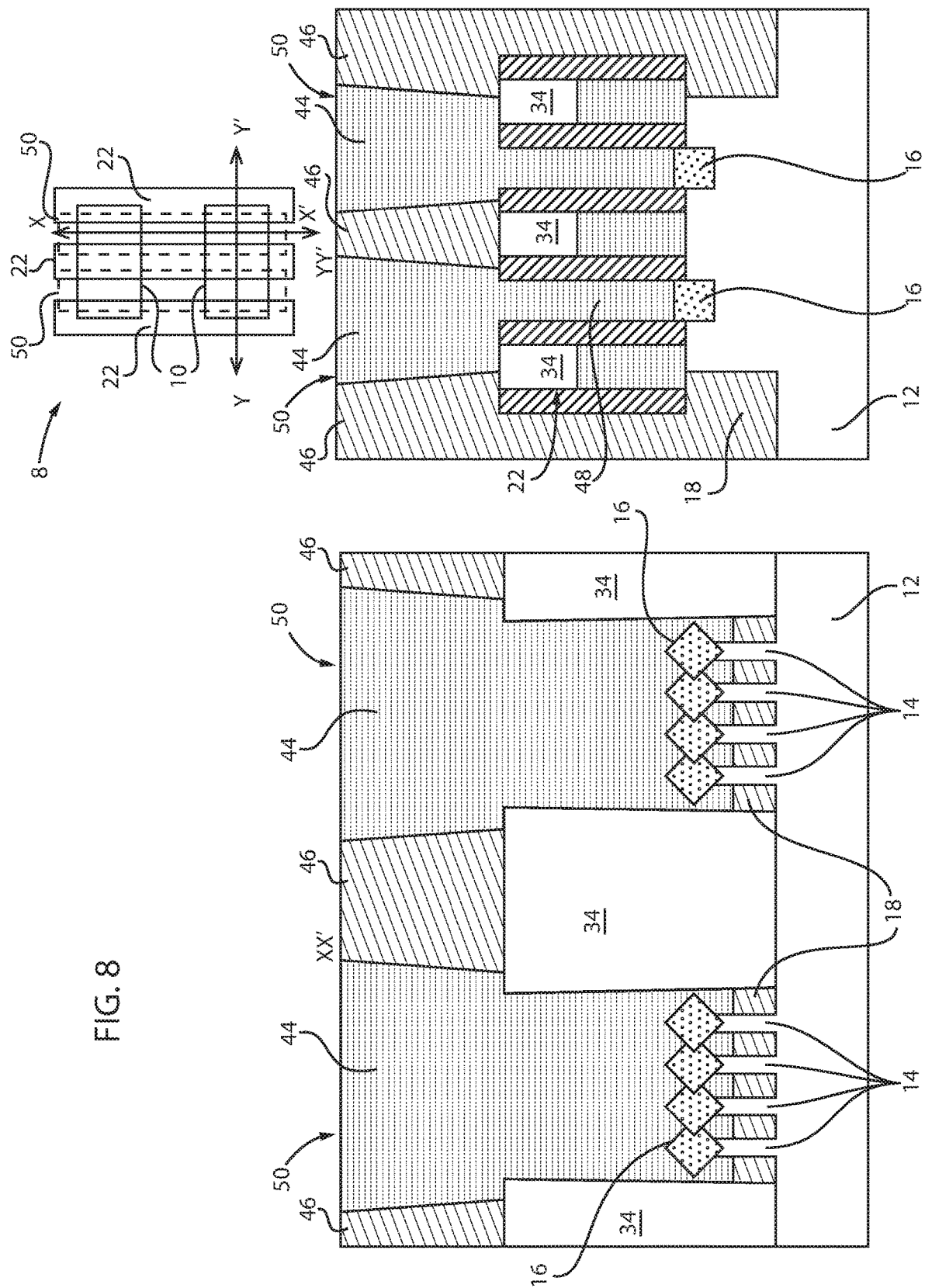
FIG. 8 is a cross-sectional view of the semiconductor device of FIG. 7 showing a schematic top view and two cross-sectional views depicting an amorphous carbon material which is replaced with dielectric around the CA contacts in accordance with the present principles.

Referring to FIG. 8, another etch process is performed to remove material 36 (e.g., amorphous carbon, other organic layer or dielectric if etching selectivity is large enough with underlying dielectric 34) selectively from dielectric layer 18, layer 34 and spacers 24. The etch process to remove material 36 may include an oxide plasma etch. After removing material 36, the material 36 is replaced with a dielectric material 46. Dielectric material 46 may include an oxide.

Dielectric material 46 fills in spaces where material 36 was removed. Dielectric material 46 may be planarized by, e.g., a CMP process.

Figure 9:
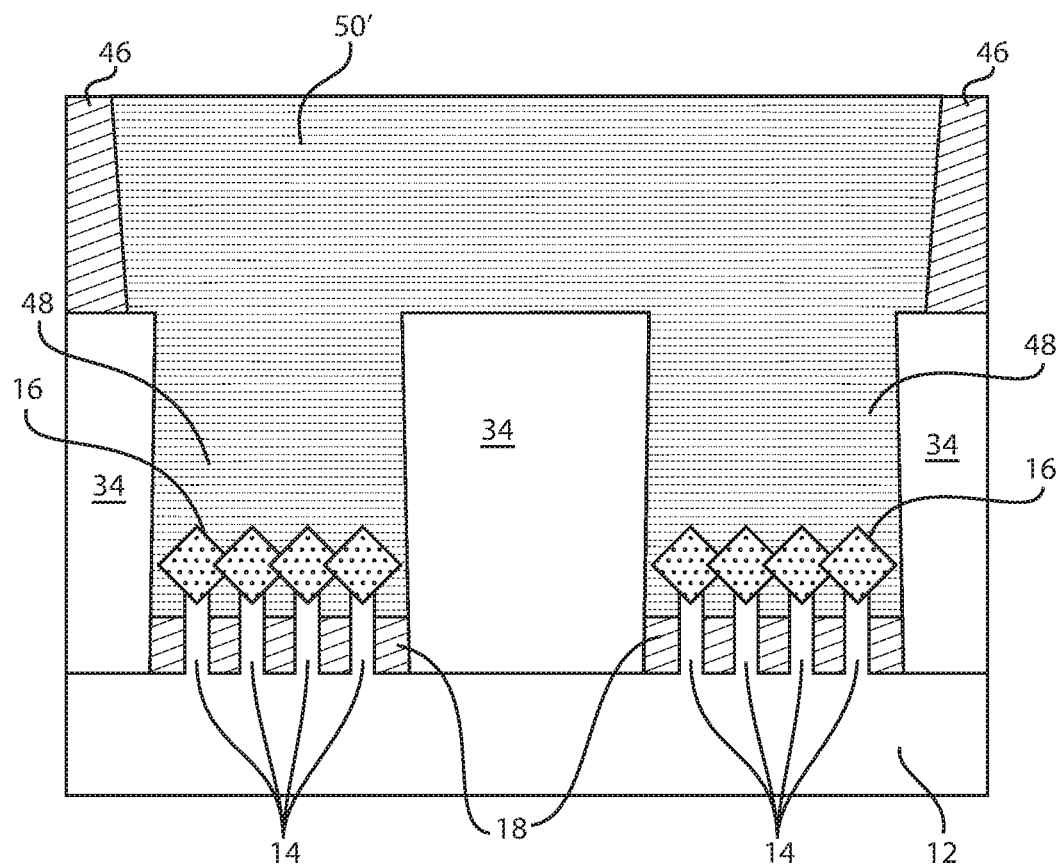
FIG. 9 is a cross-sectional view of the semiconductor device of FIG. 7 showing a CA contact shared between two silicide contacts in accordance with the present principles.

The contacts 44 form a single shared contact for all source regions on fins 14 in each region 10 and a single shared contact for all drain regions on fins 14 in each region 10. Contacts 44 may include a silicide (TS) contact 48 and a self-aligned contact (CA) 50. In FIG. 8 the CA contacts 50 are separated. In another embodiment as depicted in FIG. 9 the CA contacts 50' may be shared.

Figure 10:
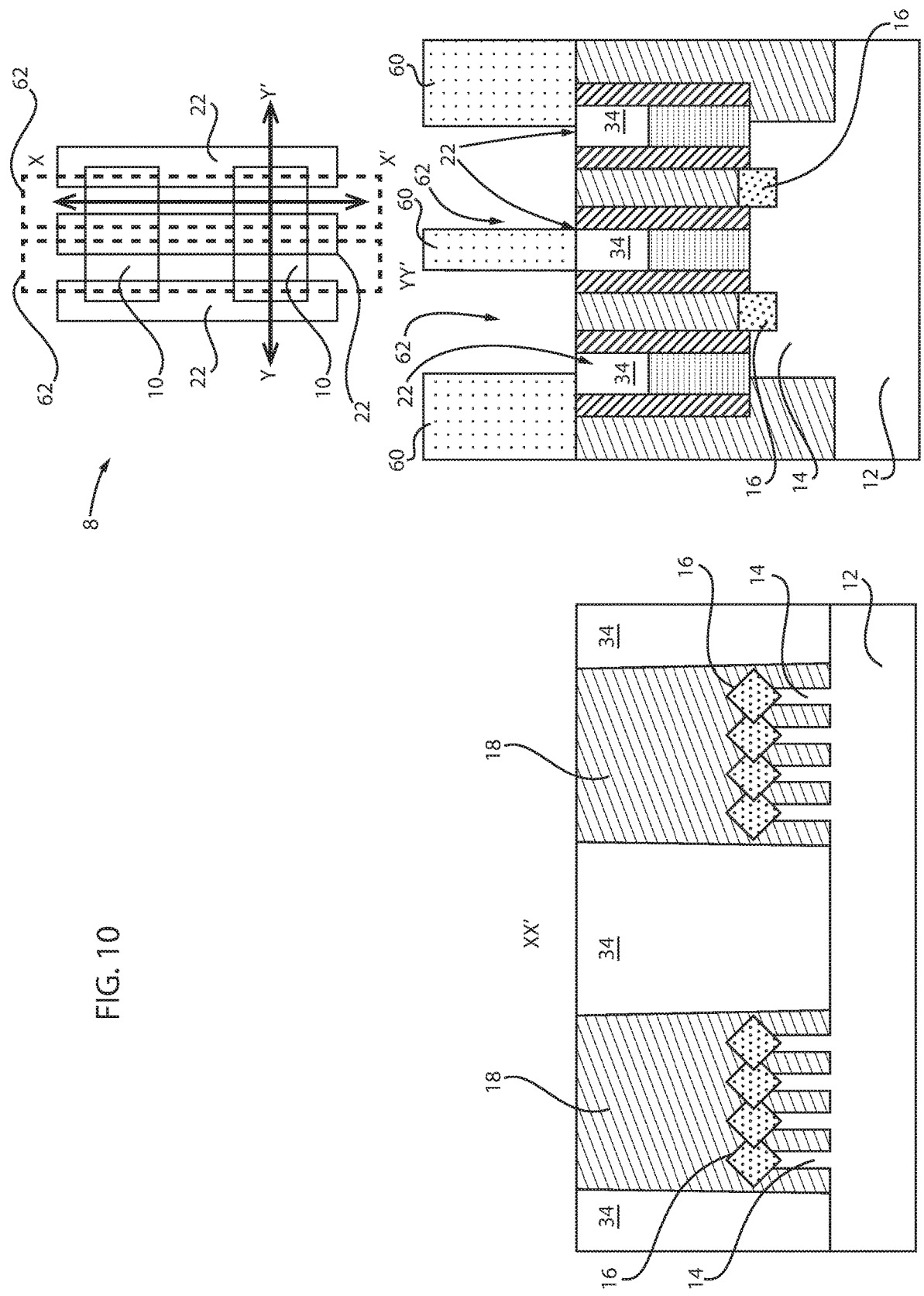
FIG. 10 is a cross-sectional view of the semiconductor device of FIG. 4 showing a schematic top view and two cross-sectional views depicting formation of an etch pattern for TS contacts in accordance with another embodiment.

Referring to FIG. 10, beginning with FIG. 4, another embodiment is illustratively shown where a contact pattern includes contact openings 62 that run along the gate structures 22. A material 60 is deposited and patterned using lithography. Material 60 may include an OPL material, amorphous carbon or a dielectric material.

Figure 11:
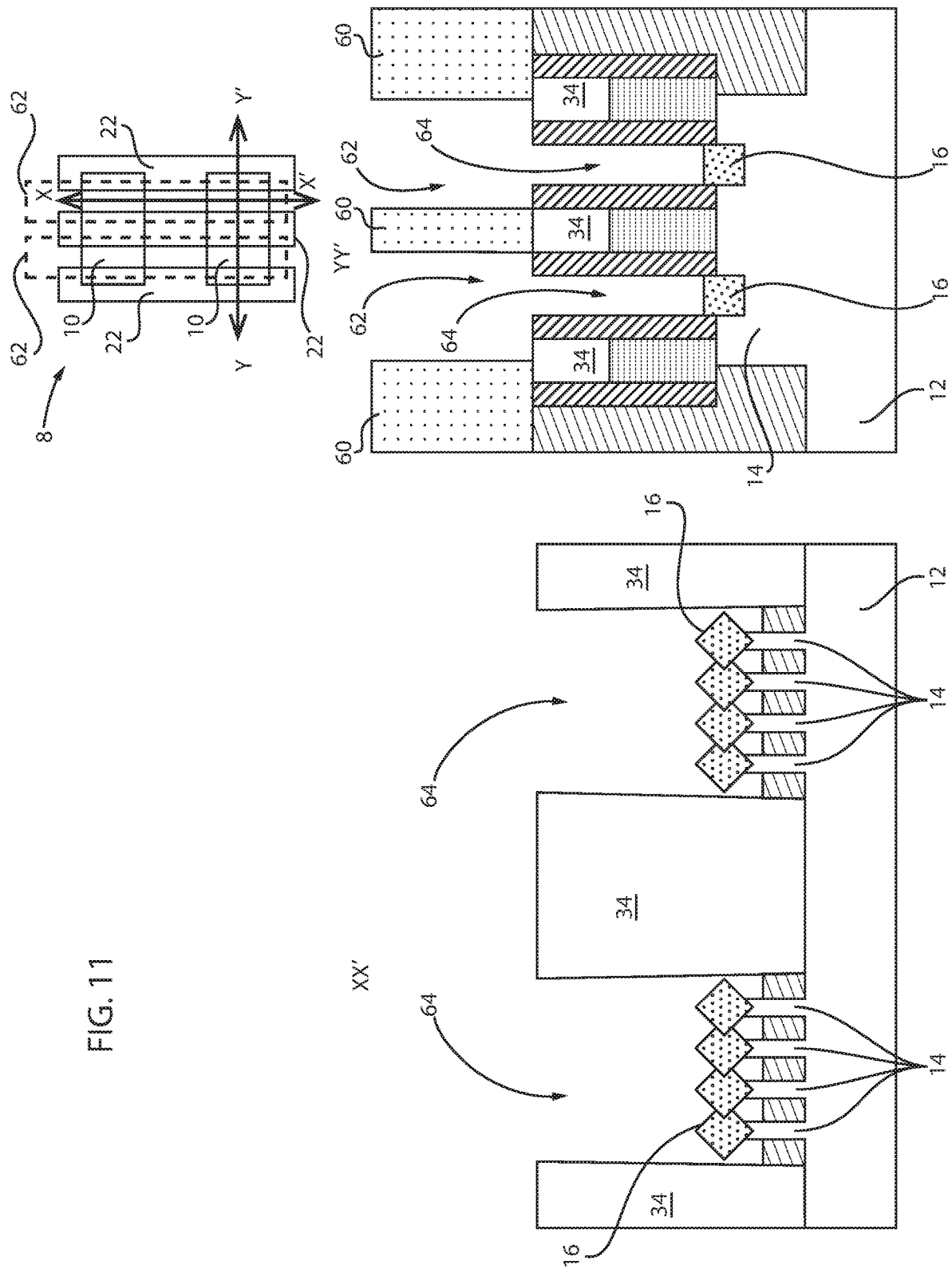
FIG. 11 is a cross-sectional view of the semiconductor device of FIG. 10 showing a schematic top view and two cross-sectional views depicting material in the source/drain contact regions removed in accordance with the present principles.

Referring to FIG. 11, an isotropic etch is performed to remove the dielectric layer 18 and recess the dielectric layer 18 to expose the S/D regions 16. The etch process removes the dielectric layer 18 selectively to the dielectric layer 34 and to the dielectric material 60 to form trenches 64. The S/D regions 16 are now accessible to form a silicide contact (TS) down to the S/D regions 16.

The isotropic etch may include a BHF wet or dry etch, or a COR process etch. The isotropic etch is highly selective and removes/recesses dielectric layer 18, e.g., an oxide, with respect to the dielectric layer 34 (e.g., SiN), and material 60 (e.g., amorphous C). The dielectric layer 34 and material 60 remain virtually intact.

Figure 12:
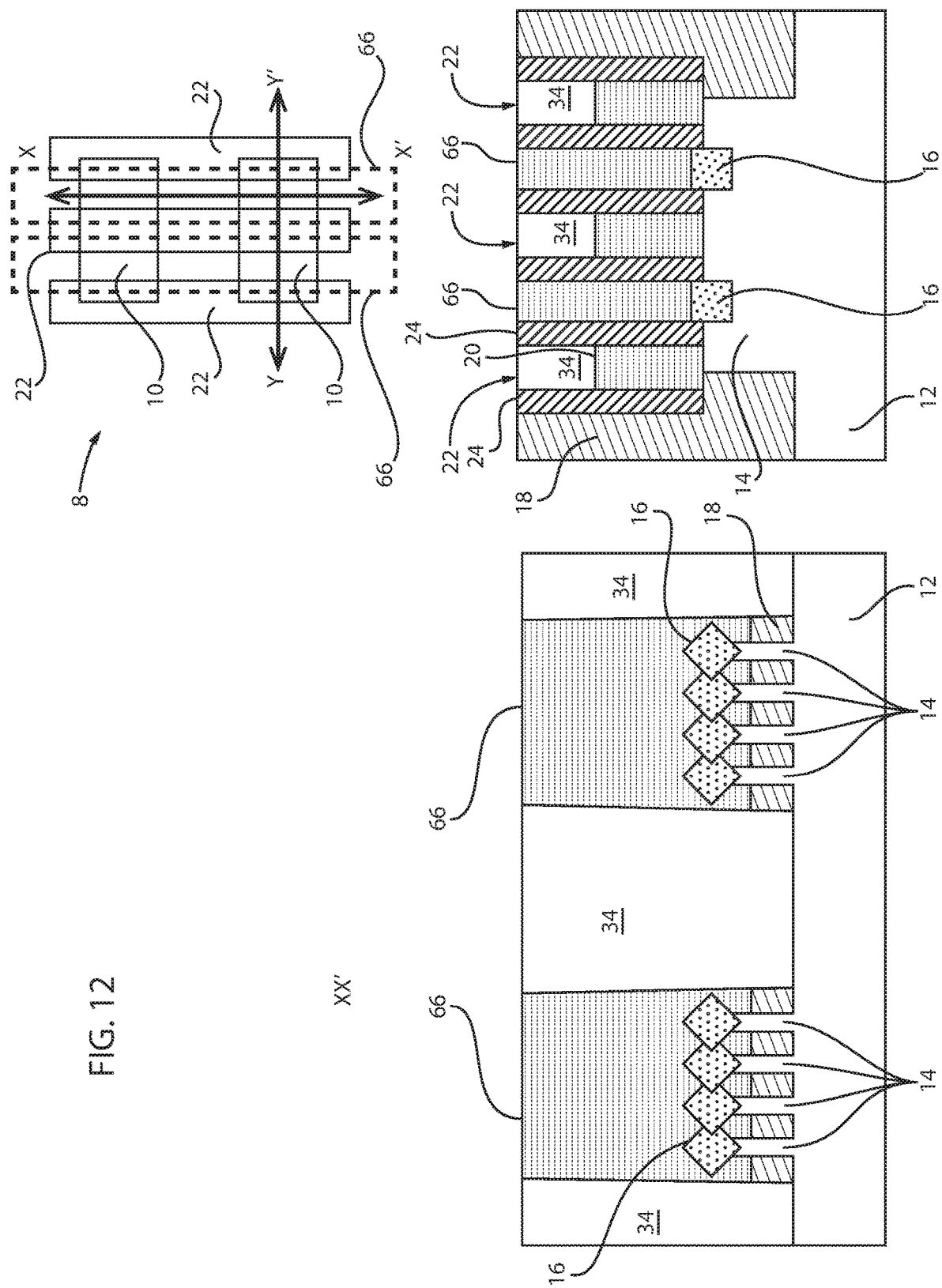
FIG. 12 is a cross-sectional view of the semiconductor device of FIG. 11 showing a schematic top view and two cross-sectional views depicting formation of silicide contacts (TS) in accordance with the present principles.

Referring to FIG. 12, the dielectric material 60 is stripped/removed. If the material 60 includes OPL an ash process may be performed. Self-aligned TS contacts 66 are formed in the trenches 64 (FIG. 11). The contacts 66 may include a liner (not shown). The liner may include, e.g., TiN, although other materials may be employed. Examples of other liner materials include, e.g., TaN, Al$_2$O$_3$, etc. The liner thickness need only be a few nanometers. The contacts 66 are formed from a metal, such as W, Al, Ti, etc. After formation of the contact material (metal and liner) a CMP process is performed to planarize a top surface. The contacts 66 land on and connect to the S/D regions 16. As before TS contacts 48 (FIG. 8) and TS contacts 66 are formed in layer 34, which may include SiN instead of an oxide material. Contacts 48 and 66 are formed having sidewalls with an angle less than 90 degrees, which means the contacts are larger at the bottom than the top of the contacts 48 and 66.

In this embodiment, further processing is needed to form CA contacts or contacts connected to the TS contacts 66. The CA contacts may be shared or separated as described above with respect to FIGS. 8 and 9. Separated portions of the CA contacts may be filled with SiN, filled with oxide or filled with a combination of materials. In one embodiment, regions 34 may include an oxide barrier formed therein. The oxide barrier may be formed to adjust dielectric properties of a barrier between TS contacts and/or CA contacts.

Figure 13:
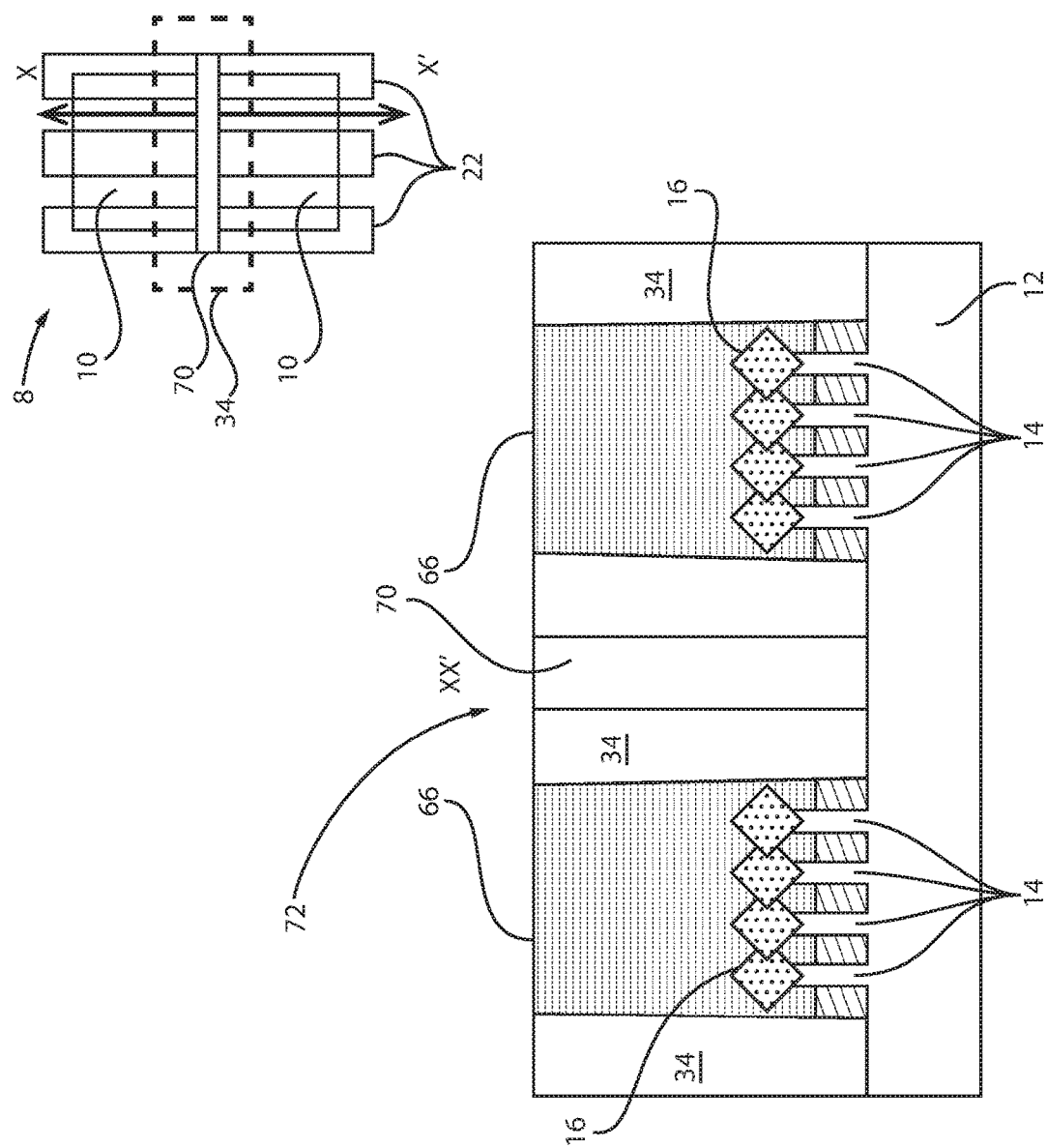
FIG. 13 is a cross-sectional view of the semiconductor device of FIG. 11 showing TS contacts separated by a barrier in accordance with the present principles.

Referring to FIG. 13, an illustrative cross-section taken at section line XX' of FIG. 12 shows an alternate structure with a dielectric material 70 formed in a TS cut region 72 between TS contacts 66. The dielectric material 70 may include an oxide and may be deposited after the formation of the layer 34. A trench may be etched into the materials of 34 that may be filled using dielectric material employed in other steps.

Figure 14:
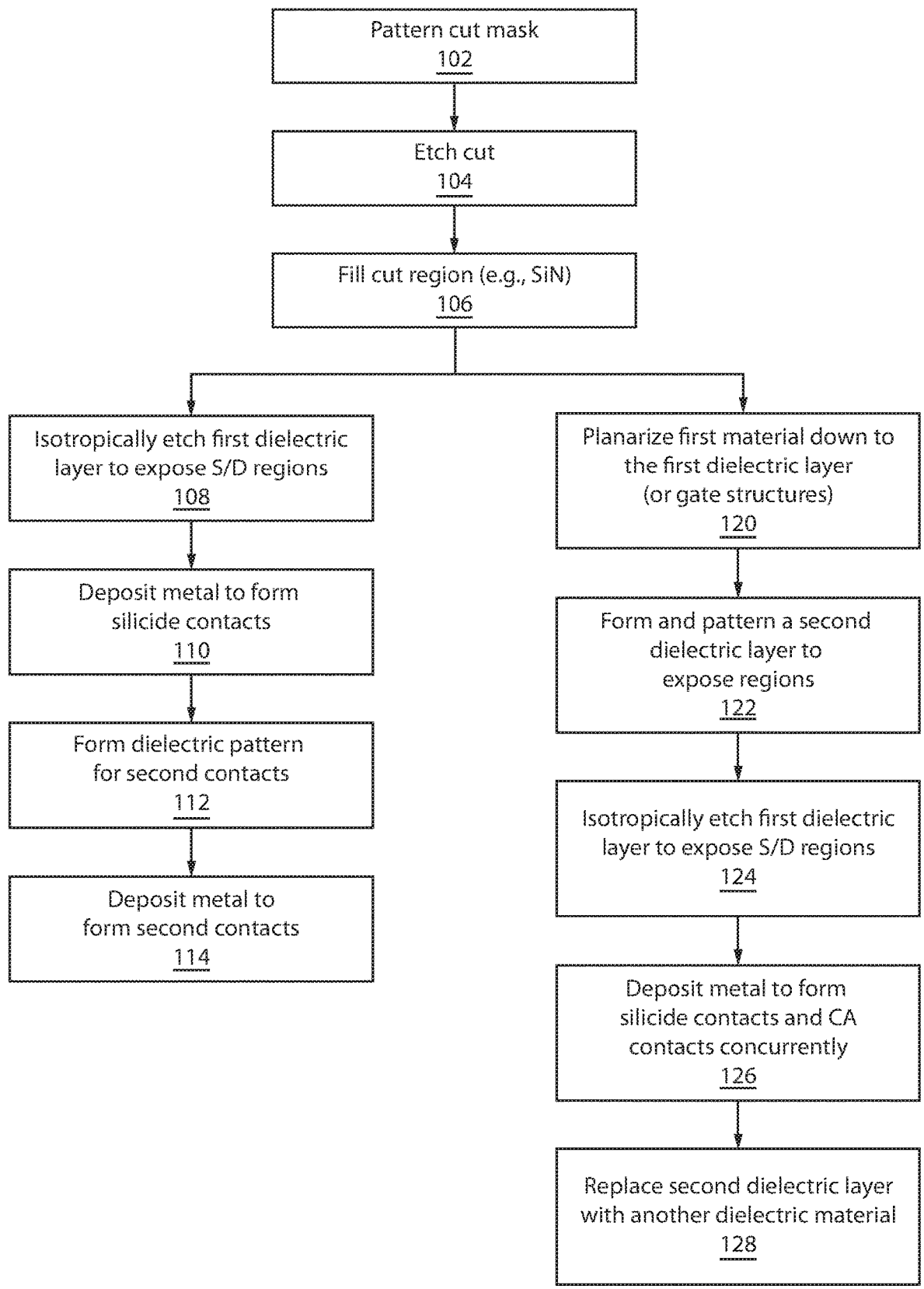
FIG. 14 is a block/flow diagram showing methods for forming self-aligned contacts in accordance with illustrative embodiments.

Referring to FIG. 14, methods for preserving interlevel dielectric in forming contacts are illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a mask is patterned between fin regions of a semiconductor device. The mask may be formed from an OPL material although other materials may be employed for lithographic patterning. In block 104, a cut is etched through a first dielectric layer between the fin regions down to a substrate using the mask. The cut forms a cut region to separate fin regions for the later formation of silicide contacts (trench silicide or TS). The cut region may be referred to as a silicide cut region or a TS cut region. In block 106, the cut region is filled with a first material, which is selectively etchable relative to the first dielectric layer (e.g., SiN). In a particularly useful embodiment, the first dielectric layer may include a silicon oxide and the first material may include a silicon nitride.

In block 108, the first dielectric layer is isotropically etched to reveal source and drain regions in the active regions and to form trenches in the first material where the source and drain regions are exposed. The S/D regions may have a protective liner (e.g., SiN) formed thereon. The isotropic etch may include a buffered hydrofluoric (BHF) wet etch. The isotropic etch is super selective (e.g., etches oxide:nitride at a ratio of 200:1 or greater and 100:1 or greater for a COR process) to remove the first dielectric layer relative to the first material and relative to gate structures disposed between the source and drain regions. In this way, the spacers of the gate structures are preserved while the first dielectric layer is efficiently recessed without concern for damage to other structures.

In block 110, metal is deposited in the trenches to form silicide contacts to the source and drain regions. The silicide contacts may extend over the gate structure and may also concurrently form self-aligned contacts or CA contacts in a single process. Alternately, the CA contacts may be formed by additional processing. In useful embodiments, the silicide contacts have a width that is larger in contact with the source and drain regions and reduced with height. In one embodiment, the contacts have a width that is larger in contact with the source and drain regions and reduced with height up to a surface of the first dielectric material or height of the gate structures. The silicide contacts may include lateral sides that form an angle of less than 90 degrees from vertical.

In block 112, when trench silicide contacts are formed in a separate process from CA contacts, a dielectric pattern is applied over the first material and the silicide contacts for forming second contacts (CA contacts) on the silicide contacts. In block 114, a metal deposition is performed to fill the dielectric pattern to form CA contacts. A planarization process may be performed to complete the contact formation. The second contacts (CA) may be separated or shared between two or more silicided (TS) contacts.

In block 120, in another embodiment, the first material may be planarized, stopping on the first dielectric layer to form a planar surface. In block 122, a second dielectric layer is formed and patterned on the planar surface to expose portions of the first dielectric layer. In block 124, the first dielectric layer is isotropically etched to expose source and drain regions in the active regions to form trenches in the first material where the source and drain regions are exposed. The isotropic etching (e.g., BHF or COR etch) is super selective to remove the first dielectric layer relative to the first material. The second dielectric layer and gate structures are disposed between the source and drain regions.

In block 126, metal is deposited in the trenches to form contacts to the source and drain regions. A planarization process may also be employed on the metal. The contacts include a first portion (e.g., TS contact) up to a height of the gate structures and an extended portion (CA contact) that extends above the gate structures. The contacts may have a width that is larger in contact with the source and drain regions and reduced with height up to a surface of the first dielectric material or gate structures. The contacts include lateral sides below a surface of the first dielectric material that forms an angle of less than 90 degrees from vertical.

In block 128, the second dielectric layer is replaced with a second dielectric material. The second dielectric layer may include amorphous carbon, which is replaced by an oxide or other suitable dielectric. In accordance with the present principles, the extended portions or CA contacts may be separated by the second dielectric material or the extended portion may be shared between two or more first portions (TS contacts). Processing continues to complete the device.

Having described preferred embodiments for self-aligned trench silicide contacts with a high selectivity process (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A device having self-aligned contacts, comprising:
    a first region and a second region each including:
        a plurality of fins formed on a substrate; and
        a first dielectric layer adjacent to at least one fin of the plurality of fins and having a bottom surface disposed directly on the substrate;
    a second dielectric layer separating the first and second regions, the second dielectric layer being disposed directly on the substrate and being directly adjacent to the first dielectric layer and having a bottom surface coplanar with the bottom surface of the first dielectric layer;
    the first and second regions each further including:
        source/drain regions disposed on respective ones of the plurality of fins and connected to each other;
        gate structures disposed between the source/drain regions, the gate structures having gate cap layers; and
        a silicide contact connected to the source/drain regions, wherein the silicide contacts have a width that is larger in contact with the source/drain regions and reduced with height to a level of the gate structures.

2. The device as recited in claim 1, wherein the silicide contacts include lateral sides that form an angle of less than 90 degrees from vertical.

3. The device as recited in claim 1, further comprising:
    second contacts formed over the silicide contacts, wherein the second contacts are separated by a third dielectric layer.

4. The device as recited in claim 1, further comprising: second contacts formed over the silicide contacts, wherein the second contacts are shared between two or more silicide contacts.

5. The device as recited in claim 1, wherein the silicide contacts are self-aligned contacts (SACs).

6. The device as recited in claim 1, wherein the second dielectric layer includes a nitride.

7. The device as recited in claim 1, wherein the first dielectric layer includes an oxide.

8. The device as recited in claim 1, wherein the silicide contacts include a liner material.

9. The device as recited in claim 1, wherein the second dielectric layer includes a material selected to support a super selective isotropic etch having an etch rate of 100:1 or greater to remove the first dielectric layer relative to the second dielectric layer during formation of trenches corresponding to the source/drain regions.

10. The device as recited in claim 1, wherein the first and second dielectric layers are disposed directly on semiconductor material of the substrate.

11. A device having self-aligned contacts, comprising:
a first region and a second region each including:
a plurality of fins formed on semiconductor material of a substrate; and
a first dielectric layer adjacent to at least one fin of the plurality of fins and having a bottom surface disposed directly on the semiconductor material of the substrate;
a second dielectric layer separating the first and second regions, the second dielectric layer being disposed directly on the semiconductor material of the substrate and being directly adjacent to the first dielectric layer and having a bottom surface coplanar with the bottom surface of the first dielectric layer;
the first and second regions each further including:
source/drain regions disposed on respective ones of the plurality of fins and connected to each other;
gate structures disposed between the source/drain regions, the gate structures having gate cap layers; and
a silicide contact connected to the source/drain regions, wherein the silicide contacts have a width that is larger in contact with the source/drain regions and reduced with height to a level of the gate structures.

12. The device as recited in claim 11, wherein the silicide contacts include lateral sides that form an angle of less than 90 degrees from vertical.

13. The device as recited in claim 11, further comprising: second contacts formed over the silicide contacts, wherein the second contacts are separated by a third dielectric layer.

14. The device as recited in claim 11, wherein the silicide contacts are self-aligned contacts (SACs).

15. The device as recited in claim 11, wherein the second dielectric layer includes a nitride.

16. The device as recited in claim 11, wherein the first dielectric layer includes an oxide.

17. The device as recited in claim 11, wherein the silicide contacts include a liner material.

18. The device as recited in claim 11, wherein the second dielectric layer includes a material selected to support a super selective isotropic etch having an etch rate of 100:1 or greater to remove the first dielectric layer relative to the second dielectric layer during formation of trenches corresponding to the source/drain regions.

* * * * *